(12) United States Patent
Jeon et al.

(10) Patent No.: US 7,553,725 B2
(45) Date of Patent: Jun. 30, 2009

(54) NONVOLATILE MEMORY DEVICES AND METHODS OF FABRICATING THE SAME

(75) Inventors: Hee-Seog Jeon, Hwaseong-si (KR);
Jeong-Uk Han, Suwon-si (KR);
Chang-Hun Lee, Suwon-si (KR);
Sung-Taeg Kang, Seoul (KR);
Bo-Young Seo, Anyang-si (KR);
Hyok-Ki Kwon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 257 days.

(21) Appl. No.: 11/488,911

(22) Filed: Jul. 18, 2006

(65) Prior Publication Data
US 2007/0045673 A1 Mar. 1, 2007

(30) Foreign Application Priority Data
Jul. 20, 2005 (KR) .................. 10-2005-0065914

(51) Int. Cl.
*H01L 21/336* (2006.01)
(52) U.S. Cl. ................ 438/257; 257/314; 257/E21.68; 257/E21.69
(58) Field of Classification Search ......... 438/257–267; 257/314–321, E21.179, E21.422, E21.423, 257/E21.68, E21.681, E21.683, E21.69
See application file for complete search history.

(56) References Cited
U.S. PATENT DOCUMENTS
6,018,178 A 1/2000 Sung

| | | |
|---|---|---|
| 6,121,072 A | 9/2000 | Choi et al. |
| 6,335,243 B1 | 1/2002 | Choi et al. |
| 6,376,310 B1 | 4/2002 | Kim |

(Continued)

FOREIGN PATENT DOCUMENTS
JP 2000296444 10/2000

(Continued)

OTHER PUBLICATIONS
English Abstract for Publication No. WO 98/18165.

(Continued)

*Primary Examiner*—Brook Kebede
(74) *Attorney, Agent, or Firm*—F. Chau & Associates, LLC

(57) ABSTRACT

A nonvolatile memory cell includes a source region and a drain region which are disposed in a semiconductor substrate and spaced apart from each other, a source selection line and a drain selection line disposed over the semiconductor substrate between the source region and the drain region. The source selection line and the drain selection line are disposed adjacent to the source region and the drain region, respectively. The nonvolatile memory cell further includes a cell gate pattern disposed over the semiconductor substrate between the source selection line and the drain selection line, a first floating impurity region provided in the semiconductor substrate under a gap region between the source selection line and the cell gate pattern and a second floating impurity region provided in the semiconductor substrate under a gap region between the drain selection line and the cell gate pattern. Distances between the cell gate pattern and the selection lines are less than widths of the selection lines.

28 Claims, 10 Drawing Sheets

U.S. PATENT DOCUMENTS

| | | | |
|---|---|---|---|
| 6,551,899 | B1 | 4/2003 | Yu et al. |
| 6,680,230 | B2 | 1/2004 | Arai et al. |
| 6,818,944 | B2 | 11/2004 | Lee |
| 6,861,685 | B2 | 3/2005 | Choi |
| 6,984,558 | B2 * | 1/2006 | Slotboom et al. ........... 438/257 |
| 7,053,443 | B2 * | 5/2006 | Lee et al. .................... 257/316 |
| 2004/0175886 | A1 | 9/2004 | Slotboom et al. |
| 2005/0009273 | A1 | 1/2005 | Chang et al. |

FOREIGN PATENT DOCUMENTS

| | | |
|---|---|---|
| JP | 2005033223 | 2/2005 |
| KR | 20040025245 | 3/2004 |
| TW | 299446 | 3/1997 |
| TW | 483003 | 4/2002 |
| TW | 525175 | 3/2003 |
| TW | 200303094 | 8/2003 |
| WO | 98/18165 | 4/1998 |
| WO | WO 2005031859 A1 * | 4/2005 |

OTHER PUBLICATIONS

English Abstract for Publication No. 2000-296444.
English Abstract for Publication No. 1020040025245.
English Abstract for Publication No. 2005-033223.
Search Report of Sep. 25, 2008 in corresponding Taiwan Patent Application No.: 095126328.
Office Action issued Sep. 26, 2008 in corresponding Chinese Patent Application No.: 200610106184.5.

* cited by examiner

NONVOLATILE MEMORY DEVICES AND METHODS OF FABRICATING THE SAME

CROSS-REFERENCE TO RELATED APPLICATION

This application claims the benefit of Korean Patent Application No. 10-2005-65914, filed Jul. 20, 2005, the contents of which are hereby incorporated by reference herein in their entirety.

TECHNICAL FIELD OF THE INVENTION

The present disclosure relates to semiconductor devices and methods of fabricating the same and, more particularly, to nonvolatile memory devices having a three-transistor memory cell and methods of fabricating the same.

BACKGROUND OF THE INVENTION

Semiconductor memory devices may be categorized, for example, as either volatile memory devices or nonvolatile memory devices. Volatile memory devices may lose their stored data when their power supplies are interrupted, whereas nonvolatile memory devices may retain their stored data even when their power supplies are interrupted. Accordingly, nonvolatile memory devices have been widely used in memory cards such as, for example, smart cards and mobile telecommunication systems such as, for example, cellular phones.

Nonvolatile memory devices may be classified, for example, as either a NAND-type flash memory device or a NOR-type flash memory device. A NOR-type flash memory device may have a relatively large sensing margin as compared to the NAND-type flash memory device. In addition, a unit cell of the NOR-type flash memory device may be composed of only one cell transistor. However, there may be certain difficulties associated with a NOR-type flash memory device. For example, when any one of memory cells of the NOR-type flash memory device is over-erased and an adjacent cell that shares a bit line of the over-erased cell has a programmed state, it may be difficult to selectively read out the data stored in the programmed cell. This is because even though the programmed cell is selected in a read mode, an undesirable leakage current may flow through the over-erased cell and the bit line connected thereto.

To solve the above-mentioned over-erasure difficulty, a two-transistor memory cell including one cell transistor and one selection transistor that are serially connected to each other has been employed with a NOR type flash memory device. The two-transistor memory cell may be programmed using a channel hot electron (CHE) injection phenomenon. Nevertheless, the above-mentioned NOR-type flash memory device may still require a large program current, and thus may also have a high power consumption.

Consequently, a three-transistor memory cell has been proposed to overcome the above-mentioned difficulties (e.g., over erasure and high power consumption) of the one-transistor memory cell and the two-transistor memory cell. The three-transistor memory cell has been widely utilized in flash memory devices of smart cards, which may selectively erase a single byte composed of 8 memory cells that are connected to 8 adjacent bit lines, respectively.

An example of the three-transistor memory cell is described in U.S. Pat. No. 6,680,230 to Arai et al., entitled "Semiconductor Device and Method of Fabricating the Same". According to Arai et al., the three-transistor memory cell includes two selection transistors and one cell transistor formed between the selection transistors, and gate patterns of the selection transistors and cell transistor are formed using conventional photolithography and etching processes. Thus, distances between the selection gate patterns and the cell gate pattern may be controlled by the resolution limit of the photolithography process. As a result, there may be a limitation in reducing the area that the three-transistor memory cell occupies. In other words, there may be a limitation in improving the integration density of a flash memory device employing the three-transistor memory cell.

Furthermore, according to Arai et al., the selection gate patterns have the same stacked gate structure as the cell gate pattern. In other words, each of the cell gate patterns includes a floating gate and a word line (or a control gate electrode) that are sequentially stacked, and each of the selection gate patterns includes a main gate electrode (or a selection line) and a dummy gate electrode, which correspond to the floating gate and the word line, respectively. Thus, a butting contact technique may be required to electrically connect the main gate electrode to the dummy gate electrode, and an additional area for the butting contact may also be required.

Thus, there is a need for a nonvolatile memory device having an improved integration density in comparison to conventional nonvolatile memory devices and for a method of forming the same.

SUMMARY OF THE INVENTION

In accordance with an exemplary embodiment of the present invention, a nonvolatile memory cell is provided. The nonvolatile memory cell includes a source region and a drain region which are disposed in a semiconductor substrate and spaced apart from each other, a source selection line and a drain selection line disposed over the semiconductor substrate between the source region and the drain region. The source selection line and the drain selection line are disposed to be adjacent to the source region and the drain region, respectively. The nonvolatile memory cell further includes a cell gate pattern disposed over the semiconductor substrate between the source selection line and the drain selection line, a first floating impurity region provided in the semiconductor substrate under a gap region between the source selection line and the cell gate pattern, and a second floating impurity region provided in the semiconductor substrate under a gap region between the drain selection line and the cell gate pattern. Distances between the cell gate pattern and the selection lines are less than the widths of the selection lines.

In some exemplary embodiments of the present invention, the cell gate pattern may include a floating gate, an inter-gate insulating layer and a word line pattern that are sequentially stacked, and each of the selection lines may be a single conductive layer. The word line pattern may include a word line and a capping layer pattern that are sequentially stacked. In this case, the floating gate may be self-aligned with the word line and the capping layer pattern, thereby having substantially the same width as the word line and the capping layer pattern. Alternatively, the word line pattern may include a word line and a capping layer pattern that are sequentially stacked and word line spacers covering sidewalls of the word line and the capping layer pattern. In this case, the floating gate may be self-aligned with the word line spacers, thereby having a greater width than the word line and the capping layer pattern.

In other exemplary embodiments, the nonvolatile memory cells may further include main spacers covering sidewalls of the selection lines and sidewalls of the cell gate pattern. The main spacers may include first main spacers filling the gap regions between the selection lines and the cell gate pattern as well as second main spacers adjacent to the source and drain regions. The source region may include a lightly doped source region disposed under the second main spacer on the sidewall of the source selection line and a heavily doped source region contacting the lightly doped source region. The drain region may include a lightly doped drain region disposed under the second main spacer on the sidewall of the drain selection line and a heavily doped drain region contacting the lightly doped drain region. The first and second floating impurity regions may have the same impurity concentration as the lightly doped source and drain regions. Sidewall capping layers may be interposed between the floating gate and the first main spacers and between the selection lines and the second main spacers.

In other exemplary embodiments, a first hard mask pattern and a second hard mask pattern may be disposed on the source selection line and the drain selection line, respectively.

In other exemplary embodiments, an interlayer insulating layer may be disposed on the substrate having the cell gate pattern and the selection lines, and a bit line may be disposed on the interlayer insulating layer. The bit line may be electrically connected to the drain region and disposed to cross over the cell gate pattern and the selection lines.

In other exemplary embodiments, a tunnel insulating layer may be disposed between the cell gate pattern and the semiconductor substrate. Also, a gate insulating layer may be disposed between the selection lines and the semiconductor substrate. The tunnel insulating layer and the gate insulating layer may be composed of the same material layer.

In accordance with an exemplary embodiment of the present invention, a method of fabricating a nonvolatile memory cell is provided. The method include forming a preliminary gate pattern on a semiconductor substrate, forming an inter-gate insulating layer pattern and a word line pattern, which are sequentially stacked, on the preliminary gate pattern, forming first sacrificial spacers on both sidewalls of the word line pattern, etching the preliminary gate pattern using the first sacrificial spacers and the word line pattern as etch masks to form a gate pattern, removing the first sacrificial spacers, and forming first and second hard mask patterns on both ends of the gate pattern, respectively. The first and second hard mask patterns are formed to be substantially parallel to the word line pattern. The method further includes etching the gate pattern using the word line pattern and the hard mask patterns as etch masks, thereby forming a floating gate, a source selection line and a drain selection line under the word line pattern, the first hard mask pattern and the second hard mask pattern, respectively. The floating gate, the inter-gate insulating layer pattern and the word line pattern constitute a cell gate pattern.

In accordance with another exemplary embodiment of the present invention, a method of fabricating a nonvolatile memory device is provided. The method include forming an isolation layer in a predetermined region of a semiconductor substrate to define a plurality of parallel active regions, forming a tunnel insulating layer on the active regions, forming a gate conductive layer on the substrate having the tunnel insulating layer, patterning the gate conductive layer to form a preliminary gate pattern having openings that expose predetermined regions of the isolation layer between the active regions and forming an inter-gate insulating layer pattern and a word line pattern, which are sequentially stacked on the substrate having the preliminary gate pattern. The word line pattern is formed across the active regions and the openings. The method further includes forming first sacrificial spacers on both sidewalls of the word line pattern, wherein first sacrificial spacers are formed to cover the openings that exist at both sides of the word line pattern, etching the preliminary gate pattern using the first sacrificial spacers and the word line pattern as etch masks to form a gate pattern, removing the first sacrificial spacers, forming first and second hard mask patterns on both ends of the gate pattern, respectively, with the first and second hard mask patterns being formed to be substantially parallel to the word line pattern, etching the gate pattern using the word line pattern and the first and second hard mask patterns as etch masks, thereby forming a plurality of floating gates overlapping the active regions under the word line pattern, and a source selection line and a drain selection line crossing over the active regions are formed under the first and second hard mask patterns respectively. The floating gates, the inter-gate insulating layer pattern and the word line pattern constitute a cell gate pattern.

BRIEF DESCRIPTION OF THE DRAWINGS

Exemplary embodiments of the present invention can be understood in more detail from the following description taken in conjunction with the accompanying drawings, in which.

DETAILED DESCRIPTION OF EXEMPLARY EMBODIMENTS

Figure 1:
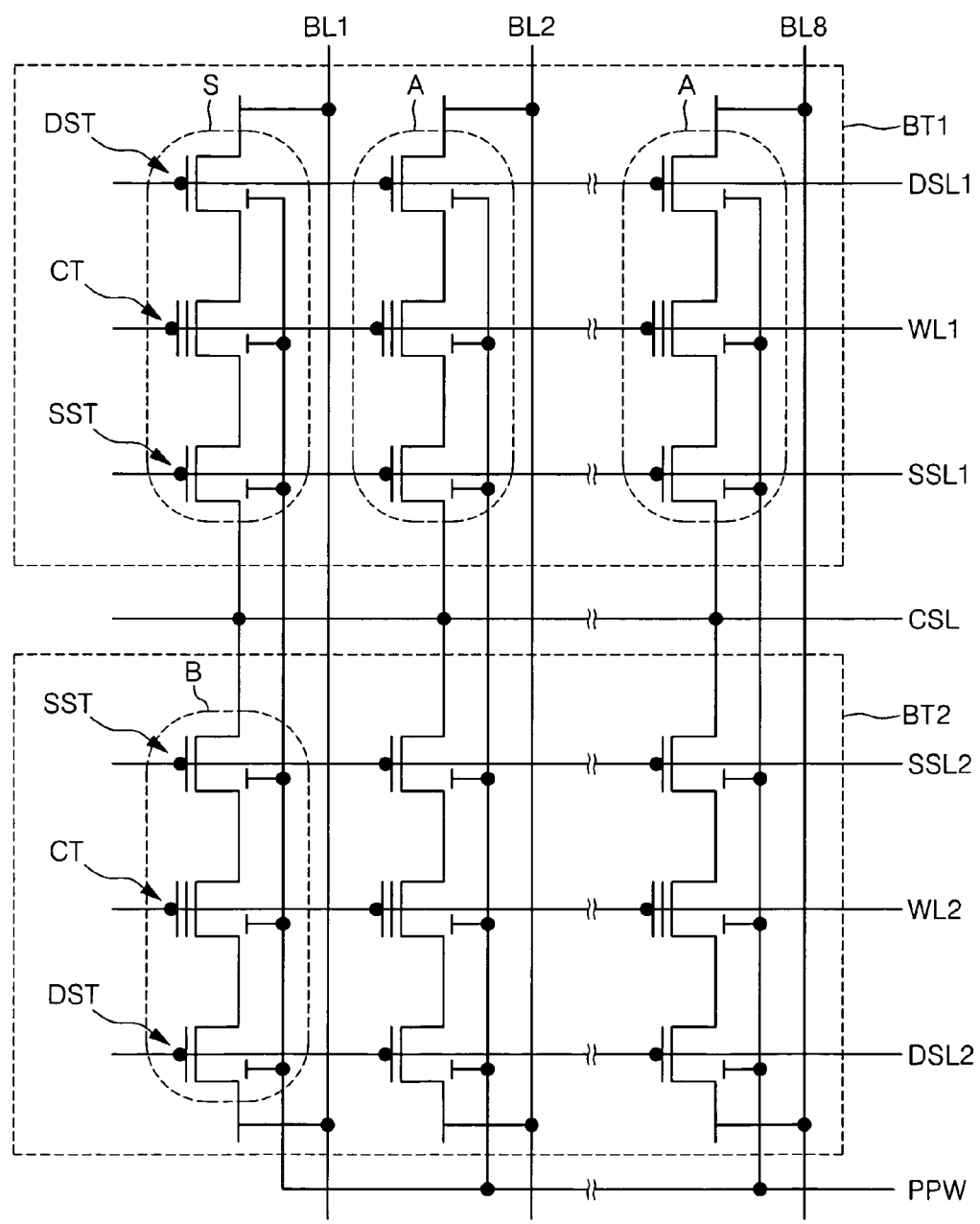
FIG. 1 is an equivalent circuit diagram illustrating a portion of a cell array region employed in a nonvolatile memory device according to an exemplary embodiment of the present invention.

The present invention will now be described more fully hereinafter with reference to the accompanying drawings, in which exemplary embodiments of the invention are shown. This invention may, however, be embodied in different forms and should not be construed as limited to the exemplary embodiments set forth herein. The same reference numerals are used to denote the same elements throughout the specification.

FIG. 1 is an equivalent circuit diagram illustrating a portion of a cell array region of a nonvolatile memory device according to an exemplary embodiment of the present invention.

Referring to FIG. 1, sixteen cells constituting 2 bytes, e.g., first and second bytes BT1 and BT2 are arrayed along rows and columns. Eight cells constituting the first byte BT1 are arrayed along a first row, and the other eight cells constituting the second byte BT2 are arrayed along a second row.

Each of the cells is composed of three transistors. For example, each of the cells includes a drain selection transistor DST, a cell transistor CT and a source selection transistor SST which are serially connected to each other. Each of the drain selection transistors DST and the source selection transistors SST may include a single gate electrode, and each of the cell transistors CT may include a floating gate and a control gate electrode that are sequentially stacked.

Gate electrodes of the drain selection transistors DST of the first byte BT1 are electrically connected to a first drain selection line DSL1, and gate electrodes of the source selection transistors SST of the first byte BT1 are electrically connected to a first source selection line SSL1. Also, control gate electrodes of the cell transistors CT of the first byte BT1 are electrically connected to a first word line WL1. Moreover, gate electrodes of the drain selection transistors DST of the second byte BT2 are electrically connected to a second drain selection line DSL2, and gate electrodes of the source selection transistors SST of the second byte BT2 are electrically connected to a second source selection line SSL2. Also, control gate electrodes of the cell transistors CT of the second byte BT2 are electrically connected to a second word line WL2.

Source regions of the source selection transistors SST of the first and second bytes BT1 and BT2 are electrically connected to a common source line CSL. Further, drain regions of the first through eighth drain selection transistors DST of the first byte BT1 are electrically connected to first through eighth bit lines BL1, BL2, . . . and BL8, respectively. Additionally, drain regions of the first through eighth drain selection transistors DST of the second byte BT2 are electrically connected to the first through eighth bit lines BL1, BL2, . . . and BL8, respectively.

The source selection transistors SST, the drain selection transistors DST and the cell transistors CT constituting the first and second bytes BT1 and BT2 may be provided in a single P-well PPW.

Consequently, the cells shown in FIG. 1 may be arrayed to have the same configuration as NOR-type flash memory cells. However, the cells, of the present exemplary embodiment 1 are operated by the same mechanism as NAND-type flash memory cells, as described hereinafter.

In the event that the cell transistors CT shown in FIG. 1 are designed to use a program voltage of about 18 V, any one of the cells of FIG. 1 may be selectively programmed using the bias conditions described in the following Table 1.

TABLE 1

| | Terminals | Bias |
|---|---|---|
| | PPW | about −8 V |
| | CSL | Floating |
| BL | Selected BL | about −8 V |
| | Non-selected BL | Vcc |
| SSL | Selected SSL | about −8 V |
| | Non-selected SSL | about −8 V |
| DSL | Selected DSL | about 0 V |
| | Non-selected DSL | about 0 V |
| WL | Selected WL | about 10 V |
| | Non-selected WL | about 0 V |

For example, to selectively program a cell S connected to the first bit line BL1 among the cells of the first byte BT1 shown in FIG. 1, voltages of about 10V, about 0V, about −8V and about −8V are respectively applied to the first word line WL1, the first drain selection line DSL1, the first source selection line SSL1 and the first bit line BL1 which are connected to the selected cell S. Moreover, voltages of about 0V, about 0V, about −8V and a power supply voltage Vcc are respectively applied to the second word line WL2, the second drain selection line DSL2, the second source selection line SSL2 and the second through eighth bit lines BL2, BL3, . . . and BL8. Also, a voltage of about −8V is applied to the P-well PPW, and the common source line CSL may be floated. In this case, all the drain selection transistors DST are turned on, and all the source selection transistors SST are turned off. Accordingly, a high voltage of about, 18 V is applied between a control gate electrode and a channel region of the cell transistors CT of the selected cell S. As a result, the selected cell S is programmed by a Fowler-Nordheim (F-N) tunneling phenomenon.

While programming the selected cell S, non-selected cells A of the first byte BT1, which are respectively connected to the second through eighth bit lines BL2, BL3, . . . and BL8, may not be programmed. This is because a program inhibition voltage (e.g., the power supply voltage Vcc) is applied to channel regions of the cell transistors CT of the second through eighth cells A.

A non-selected cell B of the second byte BT2, which is connected to the first bit line BL1, may also not be programmed during the program of the selected cell S. This is because even though a voltage of about −8V is applied to a channel region of the cell transistor CT of the non-selected cell B, a voltage of about 0V is applied to the second word line WL2 connected to the non-selected cell B.

Meanwhile, any one of the first and second bytes BT1 and BT2 shown in FIG. 1 may be selectively erased. For example, to selectively erase the first byte BT1, a voltage of about −8V and a ground voltage about (0V) may be applied to the first and second word lines WL1 and WL2, respectively, and a voltage of about 10V may be applied to the P-well PPW. In this case, an erase voltage of about 18V may be applied between the control gate electrodes and the channel regions of all the cell transistors CT of the first byte BT1, and a low voltage of about 10V may be applied between the control gate electrodes and the channel regions of all the cell transistors CT of the second byte BT2. As a result, only the cell transistors CT of the first byte BT1 may be selectively erased.

Data stored in the cells of FIG. 1 can be read out using the same method as a read mode of a typical NOR-type flash memory device. Accordingly, a read operation of the cells shown in FIG. 1 will not be described here.

Figure 2:
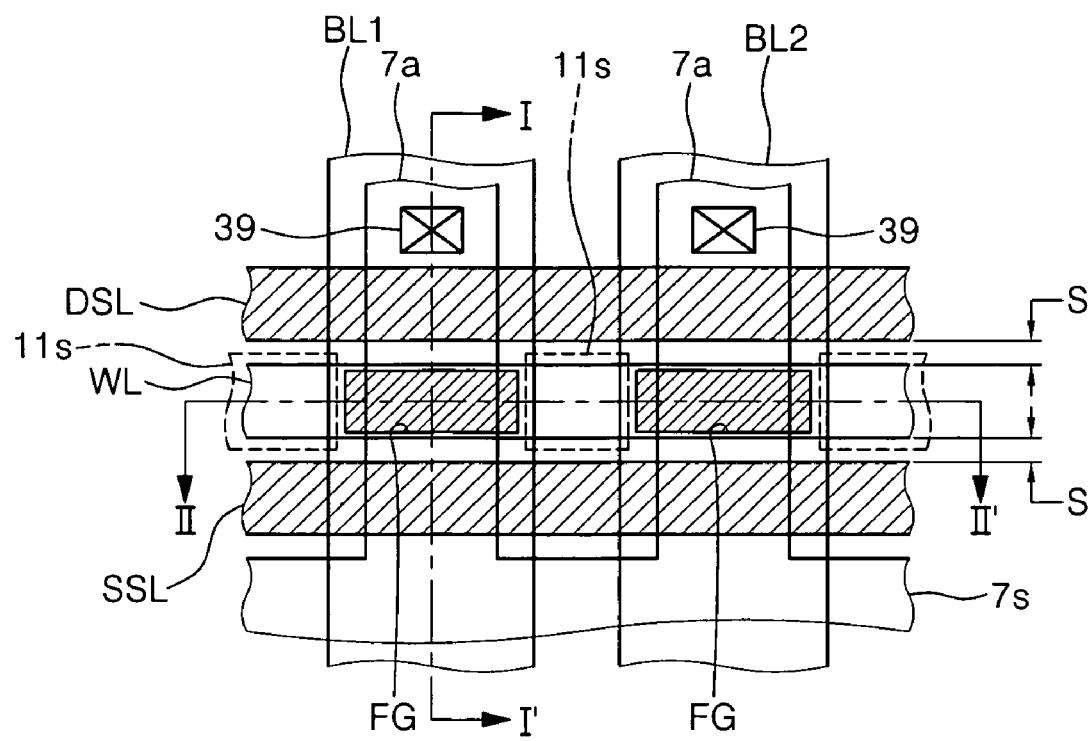
FIG. 2 is a plan view illustrating a pair of memory cells of the cell array region shown in FIG. 1.

FIG. 2 is a plan view illustrating a portion of a cell array region of a nonvolatile memory device employing three-transistor memory cells according to exemplary embodiments of the present invention. FIGS. 3A, 4A, 5A, 6A, 7A, 8A, 9A and 10A are cross-sectional views taken along line I-I' of FIG. 2 to illustrate three-transistor memory cells according to exemplary embodiments of the present invention and methods of fabricating the same, and FIGS. 3B, 4B, 5B, 6B, 7B, 8B, 9B and 10B are cross-sectional views taken along line II-II' of FIG. 2 to illustrate three-transistor memory cells according to exemplary embodiments of the present invention and methods of fabricating the same.

Figure 3A:
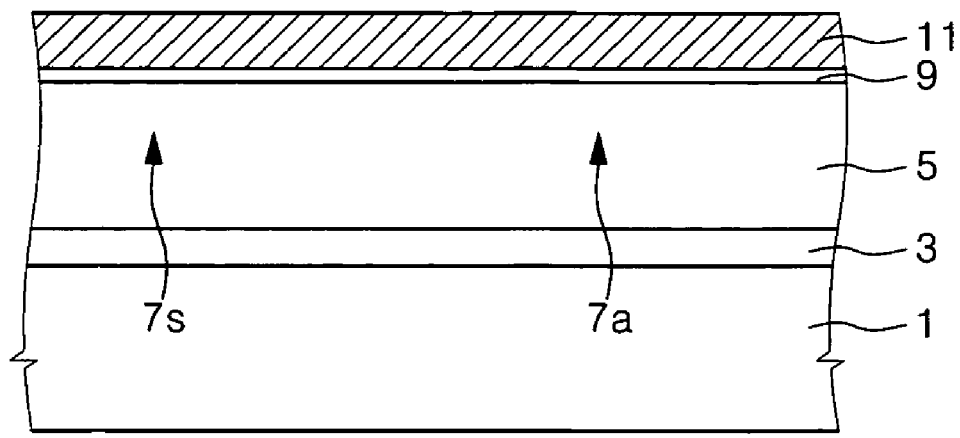
FIGS. 3A, 4A, 5A, 6A, 7A, 8A, 9A and 10A are cross-sectional views taken along line I-I' of FIG. 2 to illustrate memory cells of a nonvolatile memory device according to an exemplary embodiment of the present invention and methods of fabricating the same.
Figure 3B:
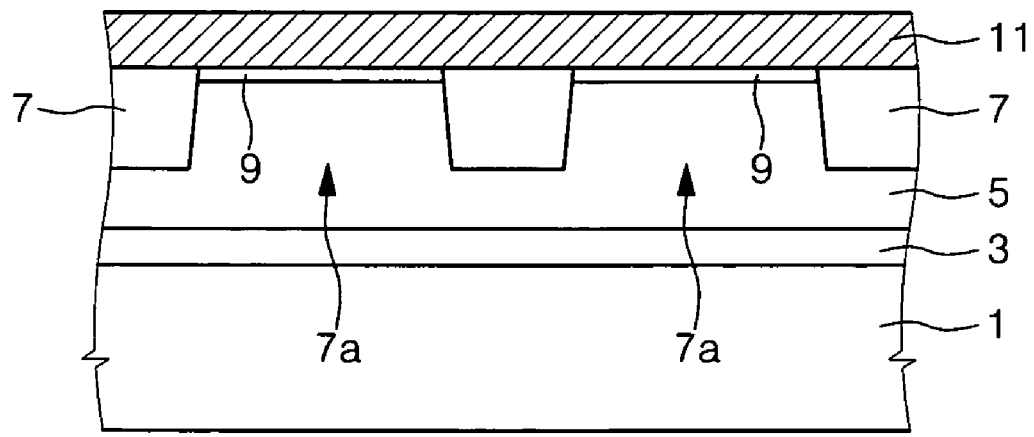
FIGS. 3B, 4B, 5B, 6B, 7B, 8B, 9B and 10B are cross-sectional views taken along line II-II' of FIG. 2 to illustrate memory cells of a nonvolatile memory device according to an exemplary embodiment of the present invention and methods of fabricating the same.

Referring to FIGS. 2, 3A and 3B, N-type impurity ions are implanted into a predetermined region of a semiconductor substrate 1 such as, for example, a silicon substrate, thereby forming an N-well 3. P-type impurity ions are implanted into the N-well 3 to form a pocket P-well 5. During formation of the pocket P-well 5, other pocket P-wells, which are spaced apart from the pocket P-well 5, may be formed in the N-well 3. The pocket P-well 5 may be formed to provide a bulk region of only the cells connected to the first through eighth bit lines BL1, BL2, . . . and BL8 of FIG. 1.

An isolation layer 7 is formed in a predetermined region of the pocket P-well 5 using a conventional isolation technique, for example, a shallow trench isolation (STI) technique, to define an active region. The active region may include a plurality of first parallel active regions 7a and a second active region (7s of FIG. 2) that cross the first parallel active regions 7a. A tunnel insulating layer 9 is formed on the active regions 7a and 7s, and a gate conductive layer 11 is formed on the substrate having the tunnel insulating layer 9. The tunnel insulating layer 9 may be formed of, for example, a thermal oxide layer, and the gate conductive layer 11 may be formed of, for example, a doped polysilicon layer.

Figure 4A:
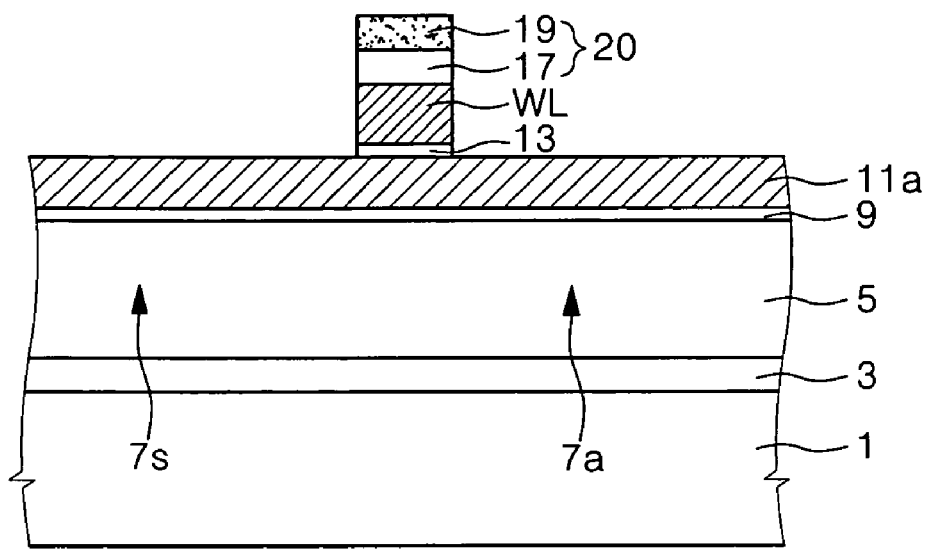
Figure 4B:
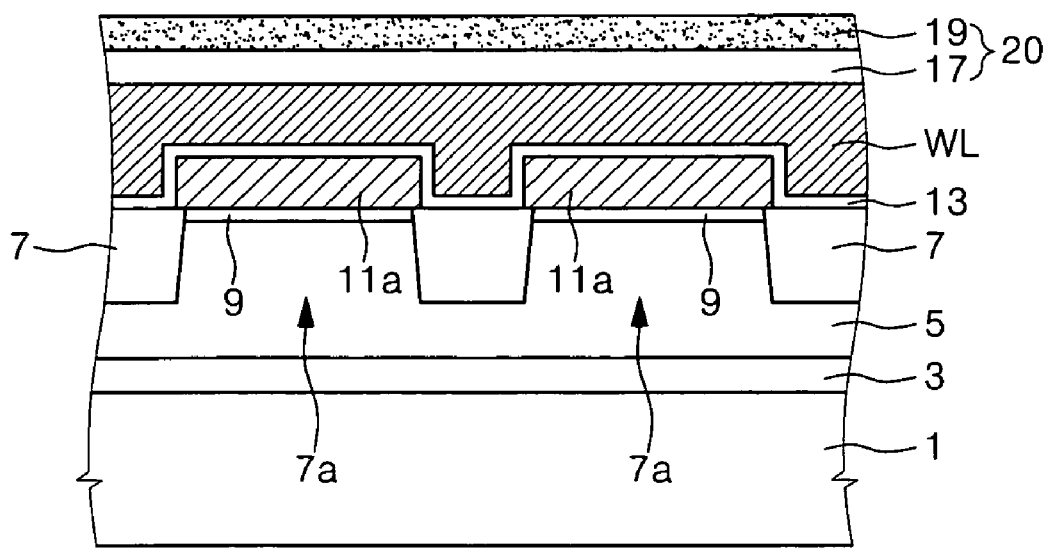

Referring to FIGS. 2, 4A and 4B, the gate conductive layer 11 is patterned to form a preliminary gate pattern 11a having openings (11s of FIG. 2) that expose predetermined regions of the isolation layer 7 between the first active regions 7a. An inter-gate insulating layer, a control gate conductive layer and a capping layer are sequentially formed on the substrate 1 having the preliminary gate pattern 11a. The inter-gate insulating layer may be formed of, for example, a dielectric layer such as an oxide-nitride-oxide (ONO) layer, and the control gate conductive layer may be formed of, for example, a single conductive layer such as a doped polysilicon layer or a stacked conductive layer of a polysilicon layer and a metal silicide layer. Also, the capping layer may be formed by sequentially stacking a main capping layer and a sacrificial capping layer. The main capping layer may be formed of an insulating material having an etch selectivity with respect to the preliminary gate pattern, and the sacrificial capping layer may be formed of an insulating material having an etch selectivity with respect to the main capping layer. For example, the main capping layer may be formed a silicon oxide layer, and the sacrificial capping layer may be formed of a silicon nitride layer.

The capping layer, the control gate conductive layer and the inter-gate insulating layer are successively patterned to form an inter-gate insulating layer pattern 13, a word line WL and a capping layer pattern 20 which are sequentially stacked. The inter-gate insulating layer pattern 13, the word line WL and the capping layer pattern 20 are formed to cross over the first active regions 7a and the openings 11s between the first active regions 7a. In this case, the inter-gate insulating layer pattern 13, the word line WL, and the capping layer pattern 20 are preferably aligned to expose both ends of each of the openings 11. That is, the word line WL may be formed to have a width less than the width of the openings 11s, as shown in FIG. 2. The capping layer pattern 20 may include a main capping layer pattern 17 and a sacrificial capping layer pattern 19 which are sequentially stacked.

Figure 5A:
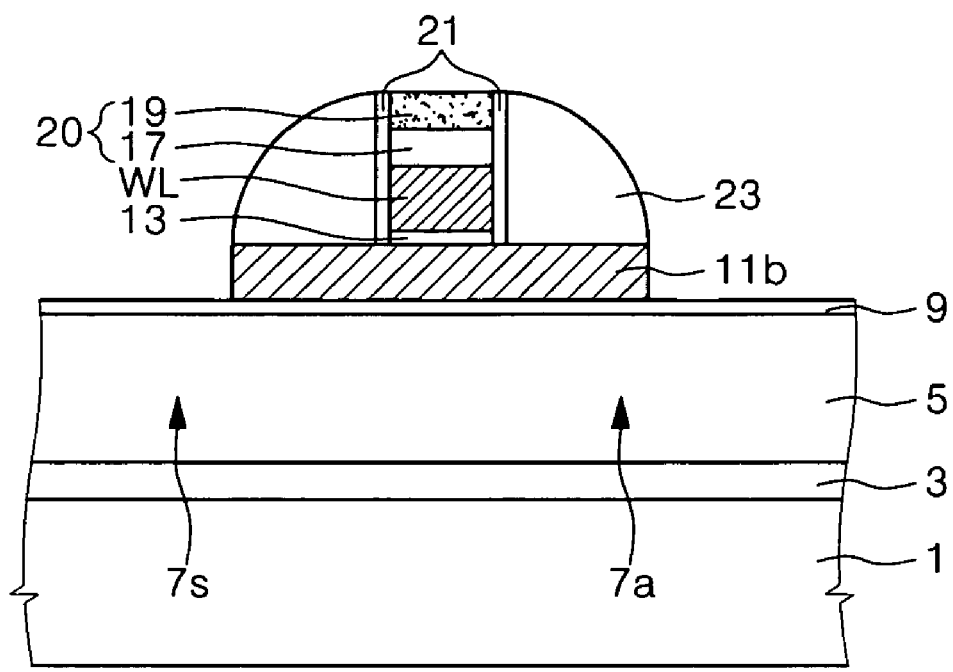
Figure 5B:
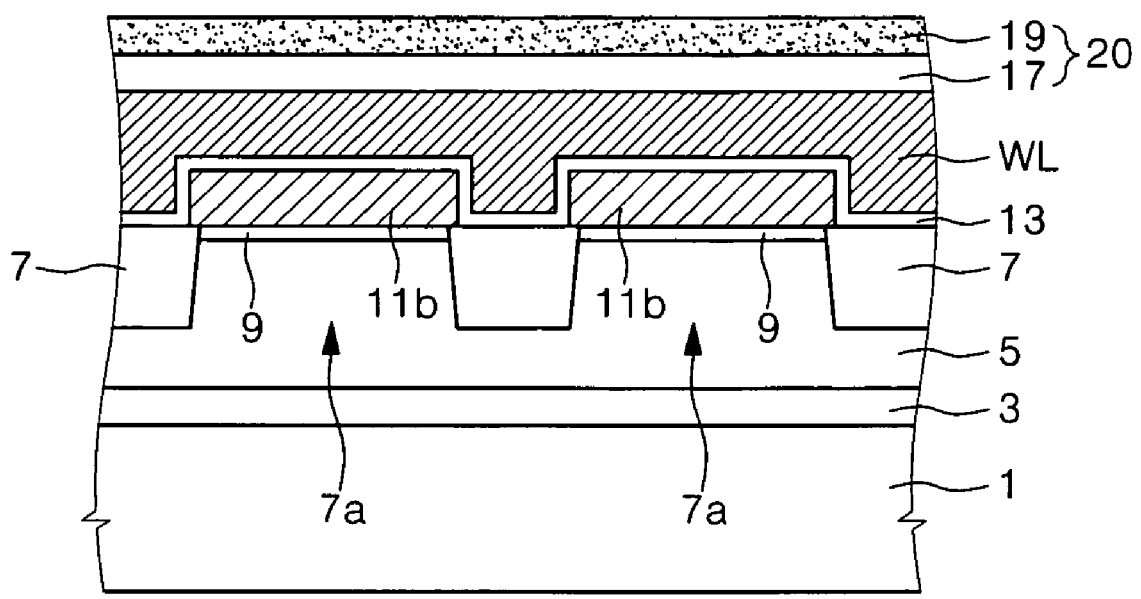

Referring to FIGS. 2, 5A and 5B, word line spacers 21 may be formed on sidewalls of the inter-gate insulating layer pattern 13, the word line WL, the main capping layer pattern 17 and the sacrificial capping layer pattern 19. The word line spacers 21 may be formed of, for example, a silicon oxide layer. The word line WL, the main capping layer pattern 17, the sacrificial capping layer pattern 19 and the word line spacers 21 constitute a word line pattern. The process of forming the word line spacers 21 may be omitted. In this case, the word line pattern may be composed of only the word line WL, the main capping layer pattern 17 and the sacrificial capping layer pattern 19.

First sacrificial spacers 23 are formed on sidewalls of the word line pattern. The first sacrificial spacers 23 may be formed of a material layer having an etch selectivity with respect to the word line spacer 21 and the preliminary gate pattern 11a. For example, the first sacrificial spacers 23 may be formed of a silicon nitride layer. During formation of the first sacrificial spacers 23, the sacrificial capping layer pattern 19 may be removed.

The preliminary gate pattern 11a is etched using the word line pattern and the first sacrificial spacers 23 as etch masks. As a result, a gate pattern 11b is formed under the word line pattern and the first sacrificial spacers 23. In this case, it is preferable that the first sacrificial spacers 23 are formed to have a sufficient width to completely cover the openings 11s which are exposed at both sides of the word line pattern. This is for preventing the gate pattern 11b from being divided by the openings 11s.

Figure 6A:
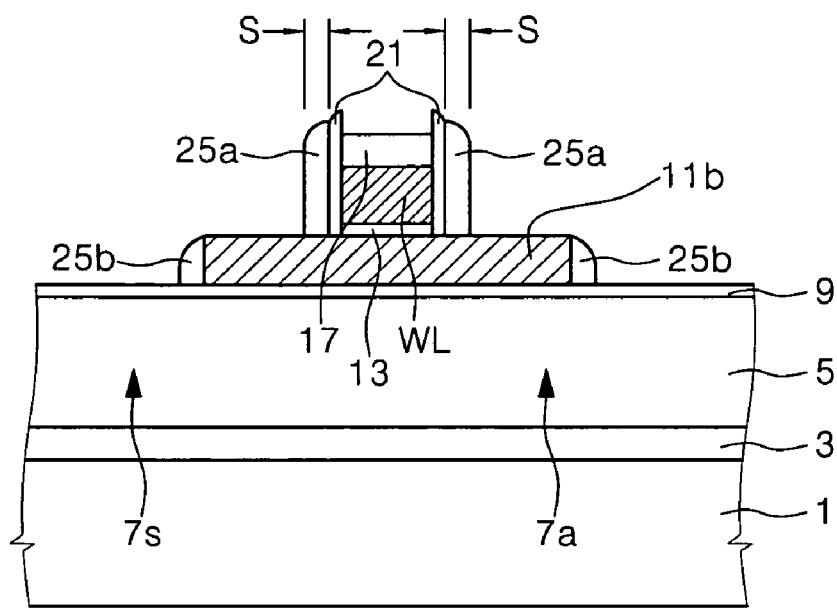
Figure 6B:
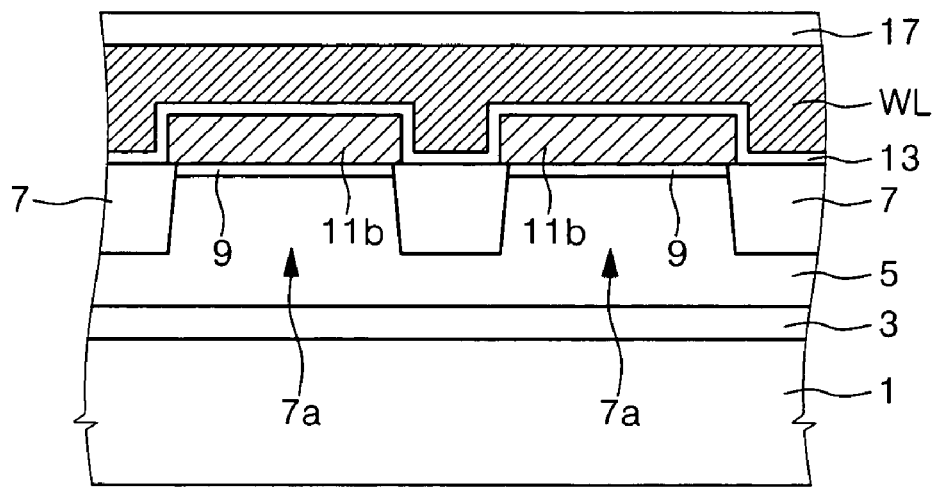

Referring to FIGS. 2, 6A and 6B, the first sacrificial spacers 23 are removed. During removal of the first sacrificial spacers 23, the sacrificial capping layer pattern 19 may also be removed to expose the main capping layer pattern 17. A second sacrificial spacer layer is formed on the substrate where the first sacrificial spacers 23 are removed, and the second sacrificial spacer layer is then anisotropically etched to form second sacrificial spacers 25a on the sidewalls of the word line pattern. In this case, second sacrificial spacers 25b may also be formed on sidewalls of the gate pattern 11b. The second sacrificial spacer layer may be formed of an oxidation resistant material layer, for example, a silicon nitride layer.

The second sacrificial spacers 25a are formed to have a smaller width S than that of the first sacrificial spacers 23 shown in FIG. 5A. Further, the width S of the second sacrificial spacers 25a may be varied, depending upon the deposition thickness of the second sacrificial spacer layer. Accordingly, if the deposition thickness of the second sacrificial spacer layer decreases, the width S of the second sacrificial spacers 25a may be controlled to be less than the resolution limit of a photolithography process.

Figure 7A:
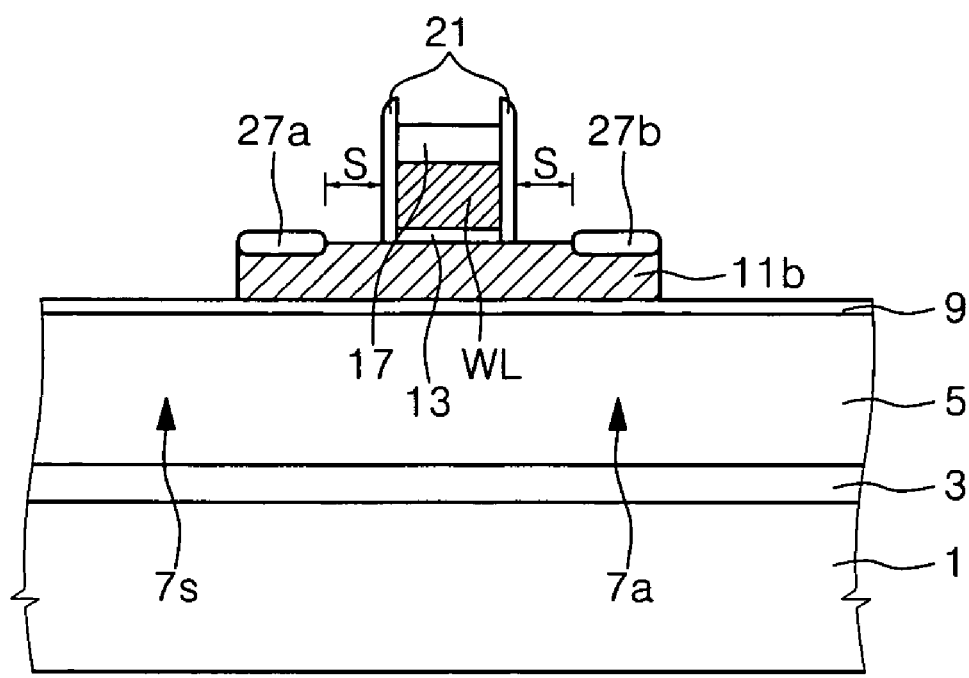
Figure 7B:
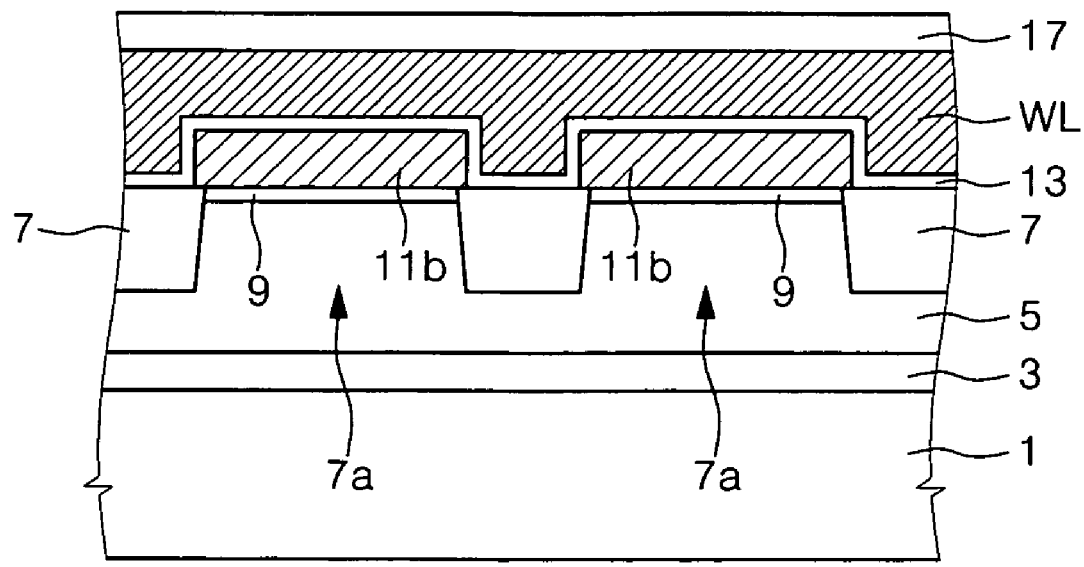

Referring to FIGS. 2, 7A and 7B, the substrate having the second sacrificial spacers 25a and 25b is thermally oxidized to form first and second hard mask patterns 27a and 27b (e.g., thermal oxide layers) on the exposed edges of the gate pattern 11b. The first and second hard mask patterns 27a and 27b are formed to be substantially parallel to the word line pattern, e.g., the word line WL. The second sacrificial spacers 25a are then selectively removed to expose top surfaces of the gate pattern 11b between the word line pattern and the hard mask patterns 27a and 27b. During removal of the second sacrificial spacers 25a, the second sacrificial spacers 25b may also be removed to expose the sidewalls of the gate pattern 11b. The exposed top surfaces of the gate pattern 11b have the same width as the width S of the second sacrificial spacers 25a.

Figure 8A:
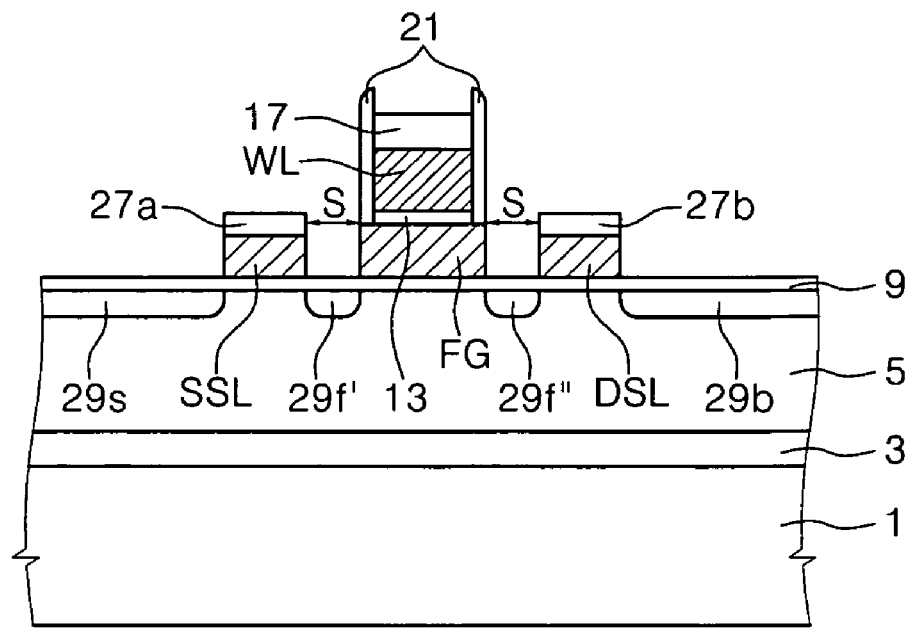
Figure 8B:
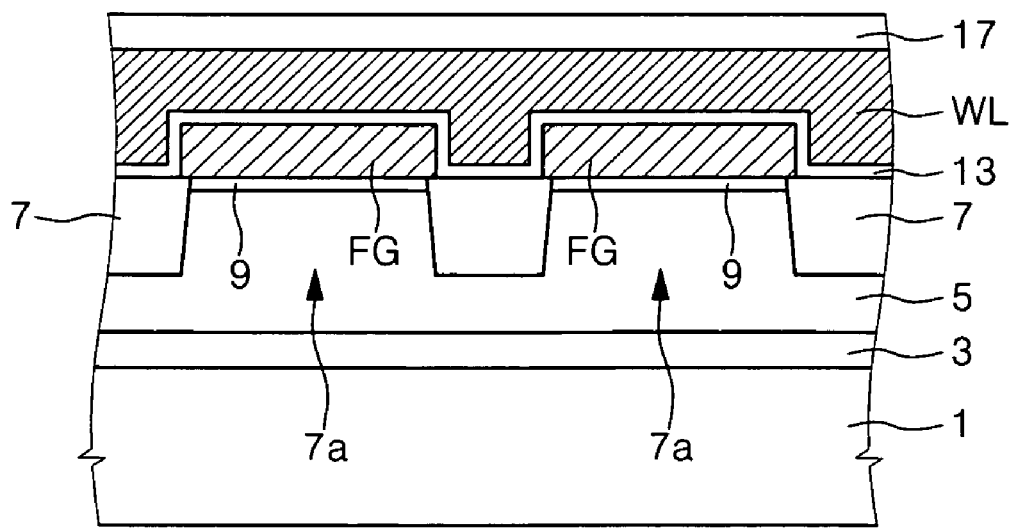

Referring to FIGS. 2, 8A and 8B, the gate pattern 11b is etched using the hard mask patterns 27a and 27b and the word line pattern as etch masks. As a result, a plurality of floating gates FG, which overlap the first active regions 7a and are spaced apart from one another, are formed under the word line pattern. In addition, a source selection line SSL and a drain selection line DSL are formed under the first and second hard mask patterns 27a and 27b, respectively. The source selection line SSL and the drain selection line DSL are formed to cross over the first active regions 7a and the isolation layer 7 between the first active regions 7a, as shown in FIG. 2. The word line pattern and the floating gates FG under the word line pattern constitute a cell gate pattern.

When the word line spacers 21 are formed, both sidewalls of the floating gates FG are self-aligned with outer sidewalls of the word line spacers 21. In this case, the width of each of the floating gates FG is equal to the sum of the width of the word line WL and the widths of the pair of word line spacers 21. Alternatively, when the process for forming the word line spacers 21 is omitted, the floating gates FG are self-aligned with the word line WL to have the same width as the word line WL.

A distance between the floating gates FG and the selection lines SSL and DSL are equal to the width S of the second sacrificial spacers (25a of FIG. 6). That is, according to the present exemplary embodiment of the invention, the distance S between the floating gates FG and the selection lines SSL and DSL may be less than the resolution limit of a photolithography process. Thus, the integration density of a nonvolatile memory device may be improved. Furthermore, according to the present exemplary embodiment of the invention, each of the selection lines SSL and DSL is composed of only a single gate electrode, as shown in FIG. 8A. Thus, unlike the conventional art, there is no need to form butting contacts with the nonvolatile memory device of the exemplary embodiments of the present invention. Consequently, with the exemplary embodiments of the present invention, the integration density of a nonvolatile memory device may be improved in comparison to nonvolatile memory devices of the conventional art.

N-type impurity ions are implanted into the first and second active regions 7a and 7s using the cell gate pattern and the selection lines SSL and DSL as ion implantation masks, thereby forming a lightly doped source region 29s in the second active region 7s adjacent to the source selection line SSL and lightly doped drain regions 29b in the first active regions 7a which are adjacent to the drain selection line DSL and located opposite to the floating gates FG. During the formation of the lightly doped source and drain regions 29s and 29b, first floating impurity regions 29f' may be formed in the first active regions 7a between the cell gate pattern and the source selection line SSL, and second floating impurity regions 29f'' may be formed in the first active regions 7a between the cell gate pattern and the drain selection line DSL. In this case, the lightly doped source and drain regions 29s and 29b may be formed to have the same impurity concentration as the floating impurity regions 29f' and 29f''.

Figure 9A:
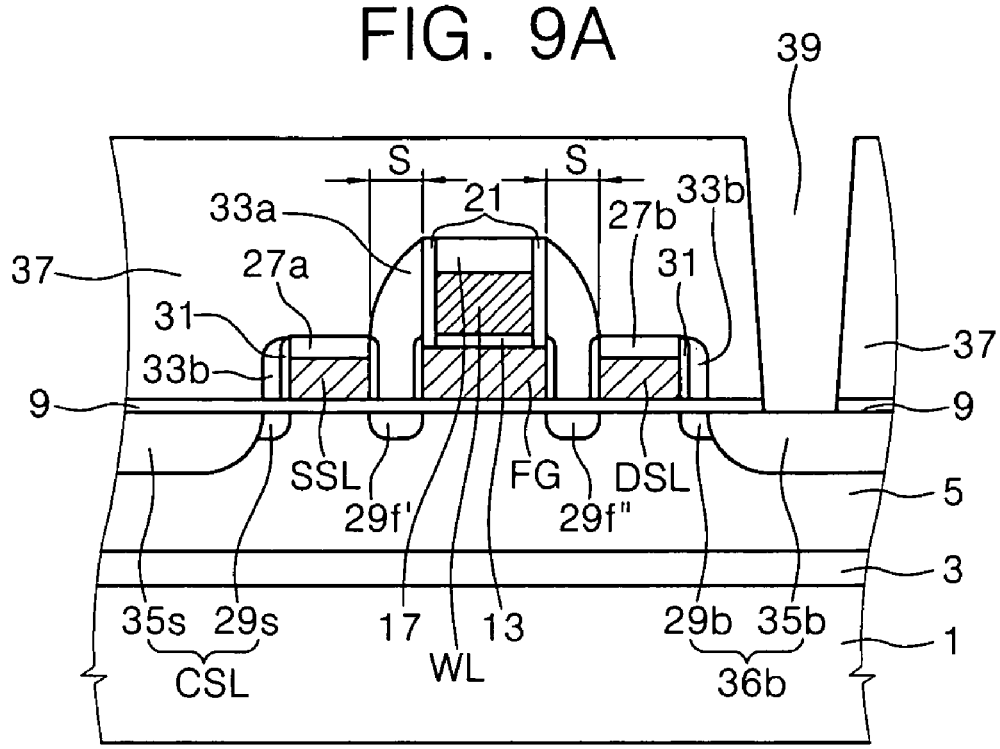
Figure 9B:
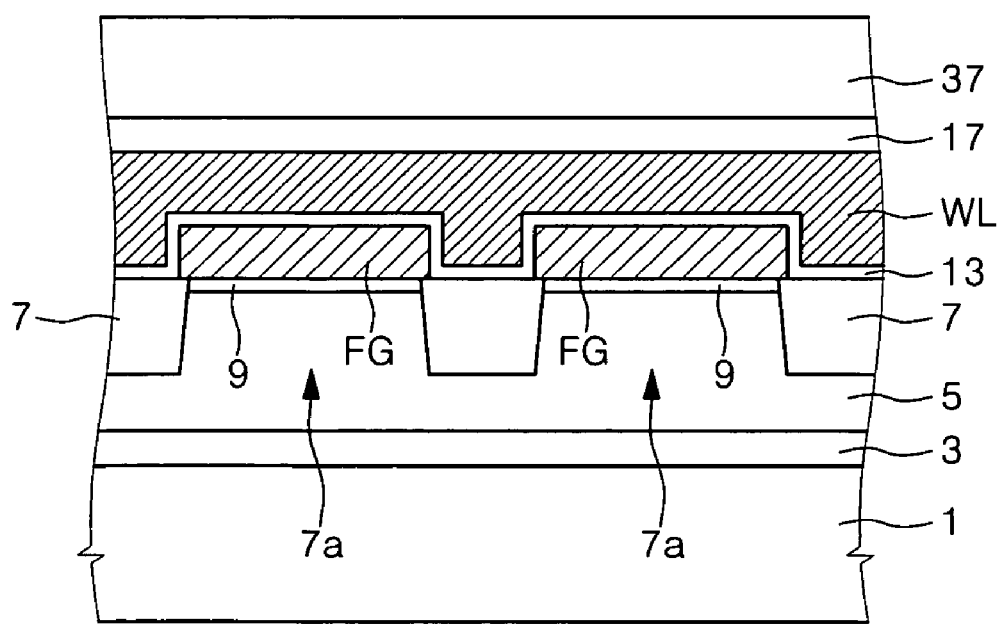

Referring to FIGS. 2, 9A and 9B, a sidewall capping layer 31 may be formed on sidewalls of the floating gates FG and sidewalls of the selection lines SSL and DSL. The sidewall capping layer 31 may be formed to cure etching damage which is applied to the semiconductor substrate 1 during formation of the floating gates FG and the selection lines SSL and DSL. The sidewall capping layer 31 may be formed of, for example, a thermal oxide layer. The sidewall capping layer 31 may be formed before or after formation of the lightly doped source and drain regions 29s and 29b and the floating impurity regions 29f' and 29f''.

A main spacer layer is formed on the substrate having the lightly doped source and drain regions 29s and 29b and the floating impurity regions 29f' and 29f''. The main spacer layer may be formed of, for example, a silicon oxide layer or a silicon nitride layer. The main spacer layer is anisotropically etched to form main spacers covering the sidewalls of the cell gate pattern and the sidewalls of the selection lines SSL and DSL. The main spacers may include first main spacers 33a which fill gap regions between the cell gate pattern and the selection lines SSL and DSL as well as second main spacers 33b which are adjacent to the lightly doped source and drain regions 29s and 29b.

When the main spacers 33a and 33b and the tunnel insulating layer 9 are formed of silicon oxide layers, top surfaces of the word line WL, the selection lines SSL and DSL, and the lightly doped source and drain regions 29s and 29b may be exposed after formation of the main spacers 33a and 33b. However, even if the main spacers 33a and 33b and the tunnel insulating layer 9 are formed of a silicon nitride layer and a silicon oxide layer respectively, the top surfaces of the lightly doped source and drain regions 29s and 29b may be exposed due to over-etching during formation of the main spacers 33a and 33b.

Subsequently, N-type impurity ions are implanted into the first and second active regions 7a and 7s using the word line pattern, the selection lines SSL and DSL, and the main spacers 33a and 33b as ion implantation masks, thereby forming a heavily doped source region 35s adjacent to the source selection line is SSL and heavily doped drain regions 35b adjacent to the drain selection line DSL. The heavily doped source and drain regions 35s and 35b may be formed to have a higher impurity concentration and a greater junction depth than the lightly doped source and drain regions 29s and 29b. In this case, the lightly doped source and drain regions 29s and 29b may remain under the second main spacers 33b, as shown in FIG. 9A. The lightly doped source region 29s and the heavily doped source region 35s constitute a common source line CSL, and the lightly doped drain region 29b and the heavily doped drain region 35b constitute a drain region 36b.

Consequently, the cell gate pattern and the first and second floating impurity regions 29f' and 29f'' constitute a cell transistor (CT of FIG. 1), and the source selection line SSL, the common source line CSL and the first floating impurity region 29f' constitute a source selection transistor (SST of FIG. 1). Also, the drain selection line DSL, the drain region 36b and the second floating impurity region 29f'' constitute a drain selection transistor (DST of FIG. 1). Thus, the tunnel insulating layer 9 between the selection lines SSL and DSL and the pocket P-well 5 corresponds to a gate insulating layer of the selection transistors SST and DST. In the present exemplary embodiment, the tunnel insulating layer 9 of the cell transistor CT may be composed of the same material layer as the gate insulating layer of the selection transistors SST and DST.

Additionally, when the hard mask patterns 27a and 27b and the tunnel insulating layer 9 are formed of a silicon oxide layer having a thickness less than that of the main capping layer 17, the hard mask patterns 27a and 27b and the tunnel insulating layer 9 may be etched to selectively expose the selection lines SSL and DSL and the heavily doped source and drain regions 35s and 35b. In this case, a metal silicide layer may be selectively formed on the selection lines SSL and DSL and the heavily doped source and drain regions 35s and 35b.

Subsequently, an interlayer insulating layer 37 is formed on the substrate having the common source line CSL and the drain regions 36b. The interlayer insulating layer 37 and the tunnel insulating layer 9 are patterned to form bit line contact holes 39 to expose the drain regions 36b.

Figure 10A:
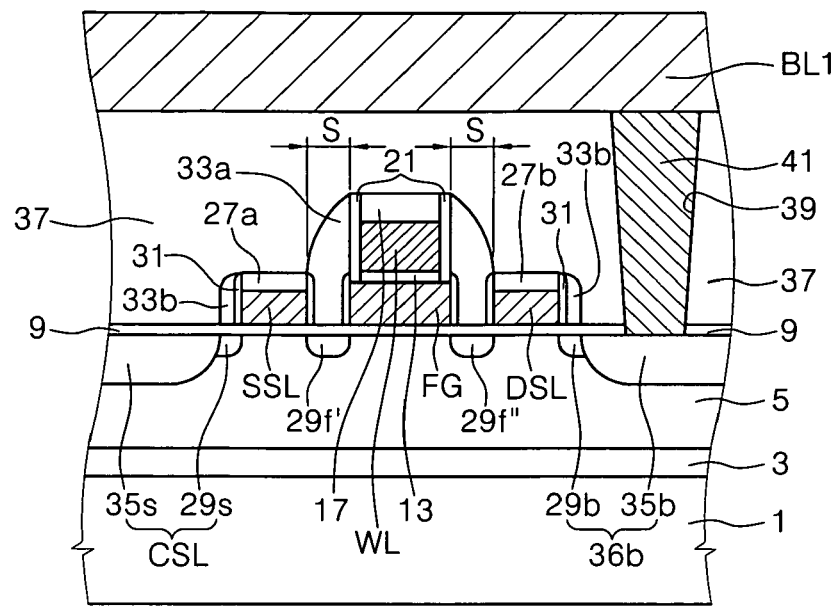
Figure 10B:
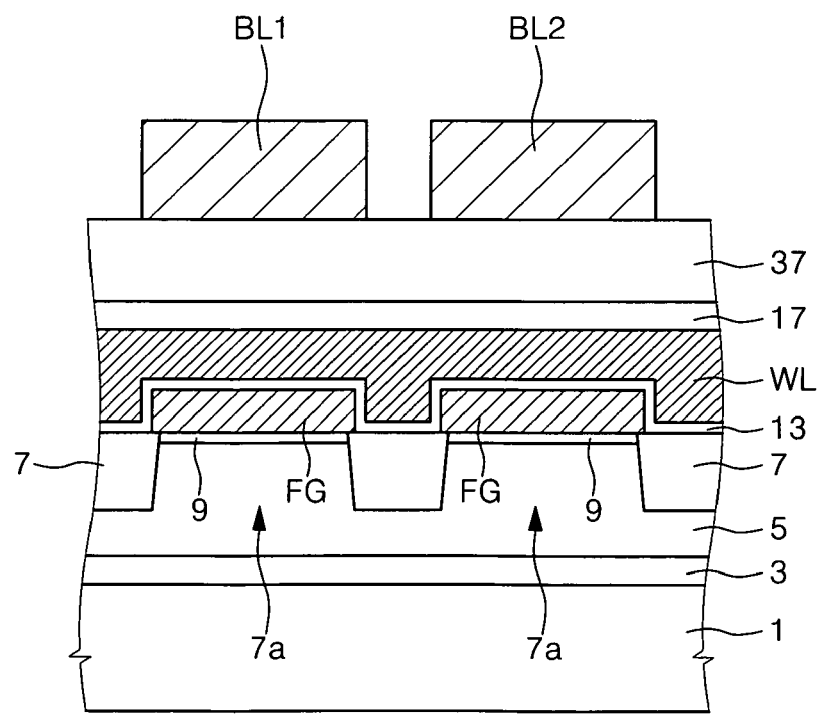

Referring to FIGS. 2, 10A and 10B, bit line contact plugs 41 are formed in the bit line contact holes 39, and a bit line conductive layer such as a metal layer is formed on the substrate having the bit line contact plugs 41. The bit line conductive layer is patterned to form a plurality of bit lines BL1 and BL2 contacting the bit line contact plugs 41. The bit lines BL1 and BL2 are formed to cross over the word line WL and the selection lines SSL and DSL.

According to the exemplary embodiments of the present invention as described above, the distance between a cell gate pattern and selection lines can be controlled by the width of second sacrificial spacers. Accordingly, the distance between the cell gate pattern and the selection lines may be less than the resolution limit of a photolithography process when the thickness of a spacer layer for forming the second sacrificial spacers is controlled. As a result, the integration density of a nonvolatile memory device employing three-transistor memory cells may be improved.

Furthermore, while the cell gate pattern is formed to have a floating gate and a word line which are sequentially stacked, each of the selection lines is formed to have a gate electrode composed of a single conductive layer. Accordingly, a butting contact technique is not required in the fabrication of three-transistor memory cells according to exemplary embodiments of the present invention. Consequently, a nonvolatile memory device employing three-transistor memory cells in accordance with exemplary embodiments of the present invention may have an improved integrated density in comparison to conventional nonvolatile memory devices.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a nonvolatile memory cell, comprising:

forming a preliminary gate pattern on a semiconductor substrate; forming an inter-gate insulating layer pattern and a word line pattern which are stacked on the preliminary gate pattern; forming first sacrificial spacers on both sidewalls of the word line pattern and on the preliminary gate pattern, thereby exposing a portion of the preliminary gate pattern; etching the exposed portion of the preliminary gate pattern using the first sacrificial spacers and the word line pattern as etch masks to form a gate pattern; removing the first sacrificial spacers to expose the portion of the gate pattern underneath where the first sacrificial spacers were positioned prior to removal; selectively forming first and second hard mask patterns on both ends of the exposed gate pattern respectively, thereby leaving the portions of the gate pattern located between the word line pattern and the first and second hard mask patterns exposed, and wherein the first and second hard mask patterns being formed substantially parallel to the word line pattern; and etching the portions of the gate pattern that are not covered by the first and second hard mask patterns using the word line pattern and the hard mask patterns as etch masks to form a floating gate under the world line pattern; and a source selection line and drain selection line under the first hard mask pattern and the second hard mask pattern, respectively, wherein the floating gate, the inter-gate insulating layer pattern and the word line pattern constitute a cell gate pattern.

2. The method according to claim 1, further comprising forming a tunnel insulating layer on the semiconductor substrate prior to formation of the preliminary gate pattern.

3. The method according to claim 1, wherein the preliminary gate pattern is formed of a polysilicon layer.

4. The method according to claim 1, wherein the forming of the inter-gate insulating layer pattern and the word line pattern comprises:

forming an inter-gate insulating layer, a control gate conductive layer and a capping layer on the substrate having the preliminary gate pattern; and patterning the capping layer, the control gate conductive layer and the inter-gate insulating layer to form an inter-gate insulating layer pattern, a word line and a capping layer pattern.

5. The method according to claim 4, further comprising forming word line spacers on sidewalls of the word line and sidewalls of the capping layer pattern.

6. The method according to claim 4, wherein the capping layer is formed by stacking a main capping layer and a sacrificial capping layer.

7. The method according to claim 6, wherein the main capping layer is formed of an insulating layer having an etch selectivity with respect to the preliminary gate pattern, and the sacrificial capping layer is formed of an insulating layer having an etch selectivity with respect to the main capping layer.

8. The method according to claim 1, wherein the first sacrificial spacers are formed of a silicon nitride layer.

9. The method according to claim 1, wherein the forming of the first and second hard mask patterns comprises:

forming second sacrificial spacers on sidewalls of the word line pattern and sidewalls of the gate pattern after removal of the first sacrificial spacers, the second sacrificial spacers being formed to have a width less than the width of the first sacrificial spacers to expose top surfaces of both ends of the gate pattern;

thermally oxidizing the substrate having the second sacrificial spacers to form thermal oxide layers on the exposed ends of the gate pattern; and removing the second sacrificial spacers.

10. The method according to claim 9, wherein the second sacrificial spacers are formed of an oxidation resistant material layer.

11. The method according to claim 10, wherein the oxidation resistant material layer is a silicon nitride layer.

12. The method according to claim 1, further comprising forming impurity regions in the semiconductor substrate, wherein the impurity regions are formed to have floating impurity regions in the semiconductor substrate between the cell gate pattern and the selection lines as well as a source region and a drain region adjacent to the source selection line and the drain selection line, respectively.

13. The method according to claim 1, further comprising implanting impurity ions into the semiconductor substrate using the cell gate pattern and the selection lines as ion implantation masks to form floating impurity regions under gap regions between the cell gate pattern and the selection lines as well as a lightly doped source region and a lightly doped drain region adjacent to the source selection line and the drain selection line, respectively.

14. The method according to claim 13, further comprising:

forming main spacers to cover sidewalls of the selection lines and sidewalls of the cell gate pattern, the main spacers being formed to include first main spacers filling the gap regions between the cell gate pattern and the selection lines as well as second main spacers formed adjacent to the lightly doped source and drain regions, respectively; and implanting impurity ions into the semiconductor substrate using the cell gate pattern, the selection lines and the main spacers as ion implantation masks to form a heavily doped source region and a heavily doped drain region.

15. The method according to claim 14, further comprising forming a sidewall capping layer on sidewalls of the floating gate and sidewalls of the selection lines prior to formation of the main spacers.

16. The method according to claim 15, wherein the sidewall capping layer is formed of a thermal oxide layer.

17. The method according to claim 12, further comprising:

forming an interlayer insulating layer on the substrate having the impurity regions; and forming a bit line on the interlayer insulating layer, wherein the bit line is electrically connected to the drain region through a bit line contact hole passing through the interlayer insulating layer.

18. A method of fabricating a nonvolatile memory device, comprising:

forming an isolation layer in a predetermined region of a semiconductor substrate to define a plurality of parallel active regions; forming a tunnel insulating layer on the active regions; forming a gate conductive layer on the substrate having the tunnel insulating layer; patterning the gate conductive layer to form a preliminary gate pattern having openings that expose predetermined regions of the isolation layer between the active regions; forming an inter-gate insulating layer pattern and a word line pattern which are stacked on the preliminary gate pattern, the word line pattern being formed across the active regions and the openings; forming first sacrificial spacers on both sidewalls of the word line pattern and on the preliminary gate pattern, thereby exposing a portion of the preliminary gate pattern, the first sacrificial spacers being formed to cover the openings that exist at both sides of the word line pattern; etching the exposed portion of the preliminary gate pattern using the first sacrificial spacers and the word line pattern as etch masks to form a gate pattern; removing the first sacrificial spacers to expose the portion of the gate pattern underneath where the first sacrificial spacers were positioned prior to removal; selectively forming first and second hard mask patterns on both ends of the gate pattern respectively, thereby leaving the portion of the gate pattern located between the word line pattern and the first and second hard mask patterns exposed, and wherein the first and second hard mask patterns being formed to be substantially parallel to the word line pattern; and etching the portion of the gate pattern that are not covered by the first and second hard mask patterns using the word line pattern and the first and second hard mask patterns as etch masks, thereby forming a plurality of floating gates overlapping the active regions-under the word line pattern as well as a source selection line and a drain selection line crossing over the active regions under the first and second hard mask patterns, respectively, wherein the floating gates, the inter-gate insulating layer pattern and the word line pattern constitute a cell gate pattern.

19. The method according to claim 18, wherein the gate conductive layer is formed of a polysilicon layer.

20. The method according to claim 18, wherein the forming of the inter-gate insulating layer pattern and the word line pattern comprises:
forming an inter-gate insulating layer, a control gate conductive layer and a capping layer on the substrate having the preliminary gate pattern; and
patterning the capping layer, the control gate conductive layer and the inter-gate insulating layer to form an inter-gate insulating layer pattern, a word line and a capping layer pattern.

21. The method according to claim 20, further comprising forming word line spacers on sidewalls of the word line and the capping layer pattern.

22. The method according to claim 20, wherein the capping layer is formed by stacking a main capping layer and a sacrificial capping layer.

23. The method according to claim 22, wherein the main capping layer is formed of an insulating layer having an etch selectivity with respect to the preliminary gate pattern, and the sacrificial capping layer is formed of an insulating layer having an etch selectivity with respect to the main capping layer.

24. The method according to claim 18, wherein the first sacrificial spacers are formed of a silicon nitride layer.

25. The method according to claim 18, wherein forming the first and second hard mask patterns comprises:
forming second sacrificial spacers on the sidewalls of the word line pattern and sidewalls of the gate pattern after removal of the first sacrificial spacers, the second sacrificial spacers being formed to have a width less than the width of the first sacrificial spacers, thereby exposing top surfaces of both ends of the gate pattern;
thermally oxidizing the substrate having the second sacrificial spacers to form thermal oxide layers on the exposed ends of the gate pattern; and
removing the second sacrificial spacers.

26. The method according to claim 25, wherein the second sacrificial spacers are formed of an oxidation resistant material layer.

27. The method according to claim 18, further comprising forming impurity regions in the semiconductor substrate,
wherein the impurity regions are formed to include floating impurity regions in the semiconductor substrate between the cell gate pattern and the selection lines as well as a source region and a drain region adjacent to the source selection line and the drain selection line, respectively.

28. The method according to claim 27, further comprising:
forming an interlayer insulating layer on the substrate having the impurity regions; and
forming a bit line on the interlayer insulating layer,
wherein the bit line is electrically connected to the drain region through a bit line contact hole passing through the interlayer insulating layer.

* * * * *